(12) United States Patent
Huang et al.

(10) Patent No.: US 6,309,914 B1
(45) Date of Patent: *Oct. 30, 2001

(54) METHOD FOR MAKING A SEMICONDUCTOR PACKAGE

(75) Inventors: Chien-Ping Huang; Chun-Chi Ke, both of Taichung (TW)

(73) Assignee: Siliconware Precision Industrices Co., Ltd., Taichung (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/285,629

(22) Filed: Apr. 3, 1999

(30) Foreign Application Priority Data

Apr. 3, 1998 (TW) .................................. 87105044

(51) Int. Cl.[7] ........................... H01L 21/44; H01L 21/48; H01L 21/50
(52) U.S. Cl. ...................................... 438/124; 264/272.17
(58) Field of Search ....................... 264/272.17; 438/124; 29/25.01

(56) References Cited

U.S. PATENT DOCUMENTS 4,954,308 * 9/1990 Yabe .
5,635,671   6/1997 Freyman et al. .................... 174/52.2
6,019,930 * 2/2000 Baresich .

* cited by examiner

Primary Examiner—David E. Graybill
(74) Attorney, Agent, or Firm—Mikio Ishimaru

(57) ABSTRACT

A method for making a semiconductor package is provided for removing from the semiconductor package excess encapsulant formed by molding compound solidified in the runners and gates of a mold after transfer molding is completed without damaging the semiconductor package. A separator is used to be mounted on a BGA substrate of the semiconductor package for the excess encapsulant to attach thereon, so that the substrate requires no cleaning treatment after transfer molding is completed. In the method, the semiconductor chip is firstly adhered to and electrically connects with the substrate. The substrate with the semiconductor chip is then mounted with the separator having at least one opening for receiving the semiconductor chip, thereby the runners and gates of the mold are positioned over the separator instead of the substrate during transfer molding, allowing the excess encapsulant to attach to the separator. The presence of the separator thus eliminates damages to the substrate caused by the removal of excess encapsulant from the separator and reduces the manufacturing cost of the semiconductor chip for that the separator is capable of repetitive use.

15 Claims, 10 Drawing Sheets

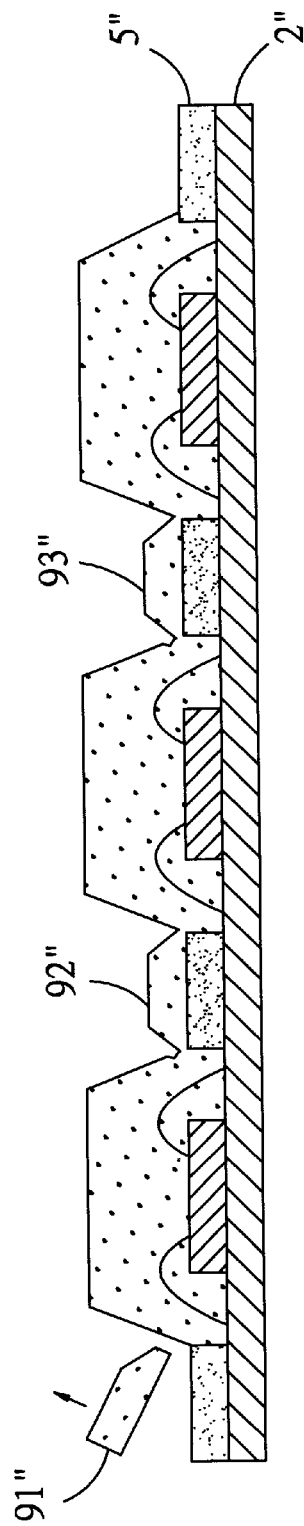
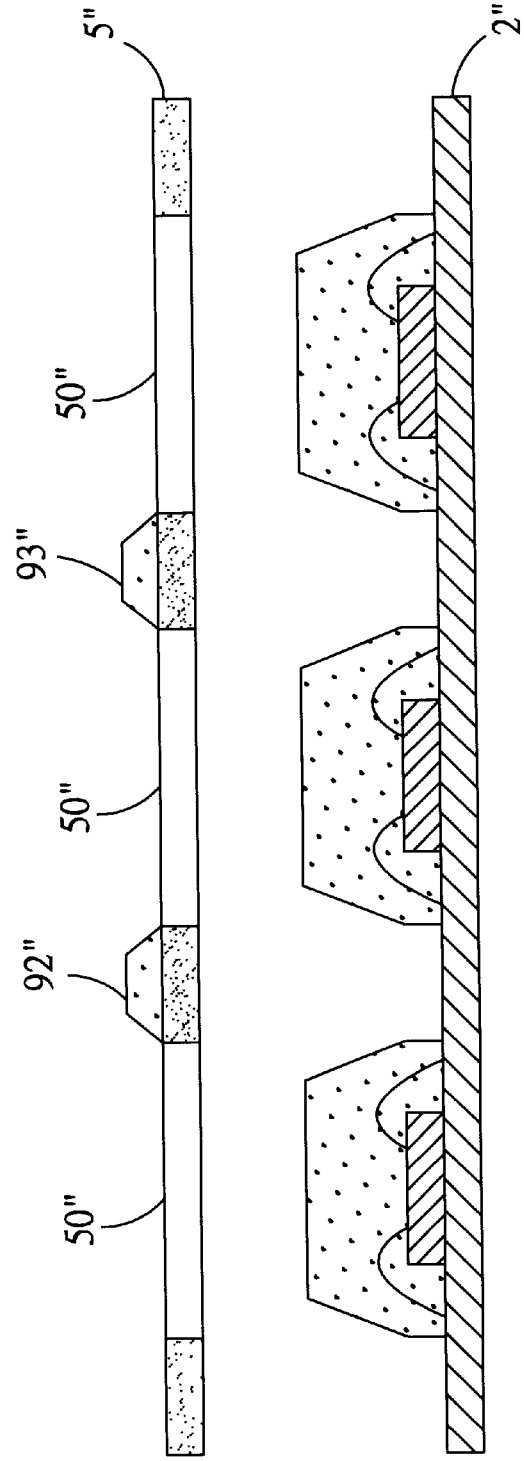

METHOD FOR MAKING A SEMICONDUCTOR PACKAGE

FIELD OF THE INVENTION

The present invention relates to a method for making a semiconductor package, and more particularly, to a method for making a semiconductor package having a semiconductor chip mounted on a BGA substrate.

BACKGROUND OF THE INVENTION

Nowadays, in the semiconductor industry, a semiconductor device not only compacts in size as well as light in weight without sacrificing its electrical performance, but also has maximum external I/O connections. As power and performance of semiconductor devices increase, so does the need for maximum I/O connections. One solution to this need is the so-called Ball Grid Array (BGA) semiconductor package.

As shown in FIG. 15, a typical BGA semiconductor package currently used by the industry usually includes a substrate 102 on which a semiconductor chip 101 is mounted. On a top surface of the substrate 102 a plurality of first conductive traces 102b are formed to have electrical connection with pads (not shown) on the semiconductor chip 101 by gold wires 103. A plurality of second conductive traces 102e are correspondingly formed on a bottom surface of the substrate 102 and electrically connect the first conductive traces 102b through plated conductive vias 102c extending through the substrate 102. The second conductive traces 102e on the bottom surface of the substrate 102 each terminate at a conductive pad 102f to form an array of pads 102f on the bottom surface of the substrate 102. A solder boll 104 is attached to each pad 102f on the bottom surface of the substrate 102 to provide external electrical accessibility to the semiconductor chip 101. An encapsulant formed by a molding compound is used to encapsulate the semiconductor chip 101 and the top surface of the substrate 102.

In the molding process for encapsulating a semiconductor chip and the surface of a substrate on which the semiconductor chip is mounted, the mold for molding is required to have a runner connected to a central reservoir for molten molding compound to flow through the runner via a gate into a mold cavity of the mold. Therefore, after the molding is completed, the molding compound in the runner and gate is solidified on the substrate and requires subsequent removal from the substrate. The region of the substrate on which the molding compound in the runner and gate is solidified is usually called "degating region." As the viscosity of the molding compound should be high enough to provide the molding compound sufficient adhesion with the semiconductor chip and the substrate in order to prevent delamination from taking place, the removal of the molding compound from the degating region on the substrate becomes difficult and often causes damage and deformation to the substrate and the semiconductor package itself.

To solve the aforesaid problem, U.S. Pat. No. 5,635,671 proposes a method for the removal of excess molding compound formed on the degating region of a substrate without damaging the semiconductor device. In the '671 invention, a layer of gold is coated on the degating region of the substrate, allowing the molding compound in the runner and gate to solidified thereon. Therefore, the molding compound in the runner and gate can be easily peeled away from the degating region without damaging or deforming the substrate and the package, for the reason that the adhesive between the molding compound and the gold coating is weaker than that between the molding compound and the substrate. However, as shown in FIG. 16, while the method proposed in the '671 invention is applied to an matrix type substrate sheet for mass production purpose, the width of each connecting portion 112 of the substrate sheet 110 for connecting any two adjacent substrate units 111 is increased for the convenience of applying the gold coating to the predetermined degating region 113 on the substrate sheet 110. Accordingly, the manufacturing cost of the substrate sheet 110 is increased.

Meanwhile, to avoid dislocation of the gold coating over degating region 113 from making the molding compound to directly solidify on areas beyond the degating region 113 of the substrate sheet 110, the application of the gold coating to the degating region 113 has to be well-controllable, thereby it makes the manufacturing cost further increased. Furthermore, gold is a precious metal and can not be retrieved from the substrate for recycling after coated on the substrate. Consequently, it is too costly to use gold as the coating material.

The '671 invention also can not be applied to a BGA semiconductor package having a cavity down structure. As shown in FIGS. 17 and 18, the encapsulant 121 and electrically conductive solder balls 122 are located on the same side of the substrate 120. Electrically conductive solder balls 122 are adhered to the overall top surface of the substrate 120 except the dented region 123 for receiving the chip 124. Thus, runners of a mold are not allowed to pass through the region where conductive solder balls 122 are adhered otherwise after the molding process is completed, the top surface of the substrate 120 is contaminated by the excess molding compound cured in the runners of the mold, thereby adversely affecting the attachment of the conductive solder balls 122 to the substrate 120.

SUMMARY OF THE INVENTION

Accordingly, it is an objective of the present invention to provide a method for making a semiconductor package that excess molding compound solidified in the runner and gate of a mold can be easily peeled away from the substrate of the semiconductor package without damaging and deforming the substrate or the encapsulant enclosing a semiconductor chip of the semiconductor package.

Another objective of the present invention is to provide a method for making a semiconductor package, which can easily remove the excess molding compound solidified in the runners and gates of a mold at a cost lower than the conventional methods, without damaging or deforming the substrate or the encapsulant enclosing a semiconductor chip of the semiconductor chip of the semiconductor package.

Still another objective of the present invention is to provide a method for making a semiconductor package, which allows the excess molding compound solidified in the runners and gates of a mold to attach to a surface of a medium instead of the surface of a substrate, thereby the surface of the substrate is free of contamination by the molding compound after molding.

A further objective of the present invention is to provide a method for making a semiconductor package, which can use a medium for the excess molding compound solidified in the runners and gates of a mold to be attached thereto, allowing the medium to be easily removed from the substrate of the semiconductor package without subsequent cleaning treatment to the substrate, after the excess molding compound is peeled away from the medium.

Still a further objective of the present invention is to provide a method for making a semiconductor package, which uses a medium for the excess molding compound solidified in the runners and gates of a mold to be attached thereto and capable of repetitive use, allowing the manufacturing cost of the semiconductor package to be reduced.

Still another further objective of the present invention is to provide a method for making a semiconductor package, which can easily mount on the substrate of the semiconductor package a medium for the excess molding compound solidified in the runners and gates of a mold to be attached thereto, without complicated positioning operation or use of auxiliary tools.

Still another further purpose of the present invention is to provide a method for making a semiconductor package, which is suitable for use of a singulated, single-arrayed, dual-arrayed, or matrix-arrayed BGA substrate.

The method for making a semiconductor package according to the aforesaid objectives of the present invention comprises the following steps:

(a) attaching a semiconductor chip to a substrate, and then making an electrical connection between the semiconductor chip and electrically conductive traces formed on the substrate;

(b) placing the substrate with the semiconductor chip on a lower mold of a two-piece mold;

(c) mounting on the substrate a separator having at least one opening for receiving the semiconductor chip attached to the substrate, wherein the opening is greater in area than the semiconductor chip so that the semiconductor chip is peripherally surrounded by the boundary of the opening;

(d) covering an upper mold of the two-piece mold over the lower mold for transferring molding compound through a mold runner and a mold gate connected to a mold cavity of the two-piece mold within which the substrate with the semiconductor chip are received, into the mold cavity to form an encapsulant enclosing the semiconductor chip and at least a portion of the surface of the substrate to which the semiconductor is attached; and (e) removing away from the separator excess molding compound solidified in the mold runner and mold gate subsequent to the removal of the mold, followed by separating the separator from the substrate.

One way for mounting the separator on the substrate is to form a plurality of insertion holes in the separator corresponding to a plurality of through holes formed in the substrate. When the stacked separator and substrate are placed on the lower mold, the insertion holes of the separator and the through holes of the substrate allow a plurality of posts protruded from a top surface of the lower mold to insert thereinto, respectively. By this arrangement, the separator and substrate can be both secured to the top surface of the lower mold, and the separator can be easily separated from the substrate without damaging the substrate. Another way of combination of the separator and the substrate can be accomplished by using a clamping jig to clamp the separator and the substrate, thereby no insertion holes and through holes are required for the separator and the substrate.

Furthermore, an electrical connection between the semiconductor chip and the substrate can be accomplished by conventional wire bonding or flip chip bumping methods.

BRIEF DESCRIPTION OF THE DRAWINGS

The above and other objects, features and other advantage of the present invention will be more clearly understood from the following detailed description taken in conjunction with the accompanying drawings, in which:

FIG. 13 is a cross-sectional view taken through the line C—C of FIG. 12, showing that the excess molding compound solidified in the runners and gates of a mold is peeled away from the separator;

FIG. 14 is a cross-sectional view which illustrates that the separator is removed from the substrate of the encapsulated package shown in FIG. 13;

In the method for making a semiconductor package according to the present invention, a conventional two-piece mold consisting of an upper mold and a lower mold is applicable and any type of conventional BGA substrates is also suitable for making a semiconductor package by the method of the present invention.

Figure 8:
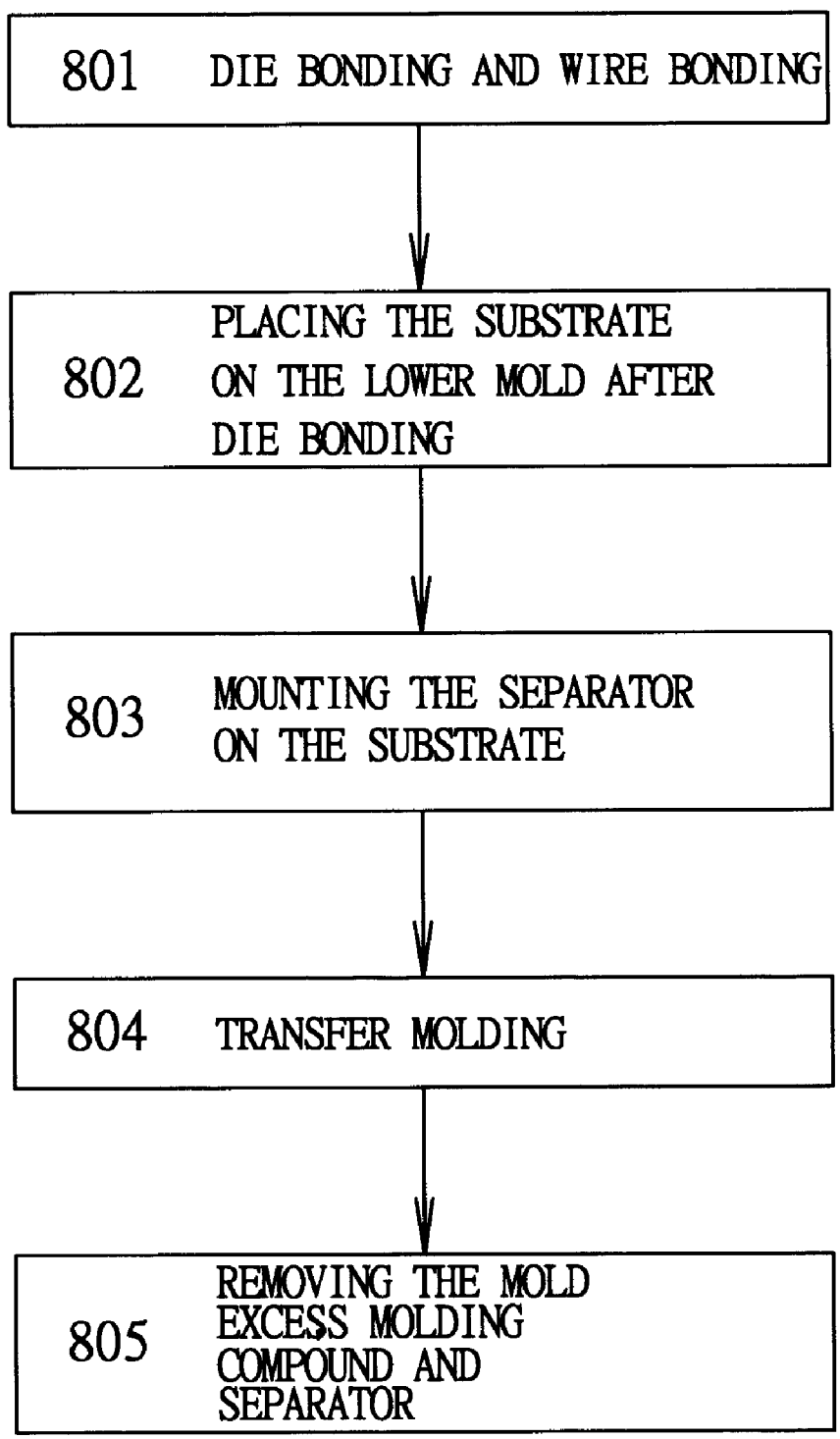
FIG. 8 is a block diagram of steps for making the semiconductor package in accordance with a second embodiment of the present invention.

In FIG. 8, a block diagram of the first embodiment of the method for making a semiconductor package of the present invention is shown.

Figure 1:
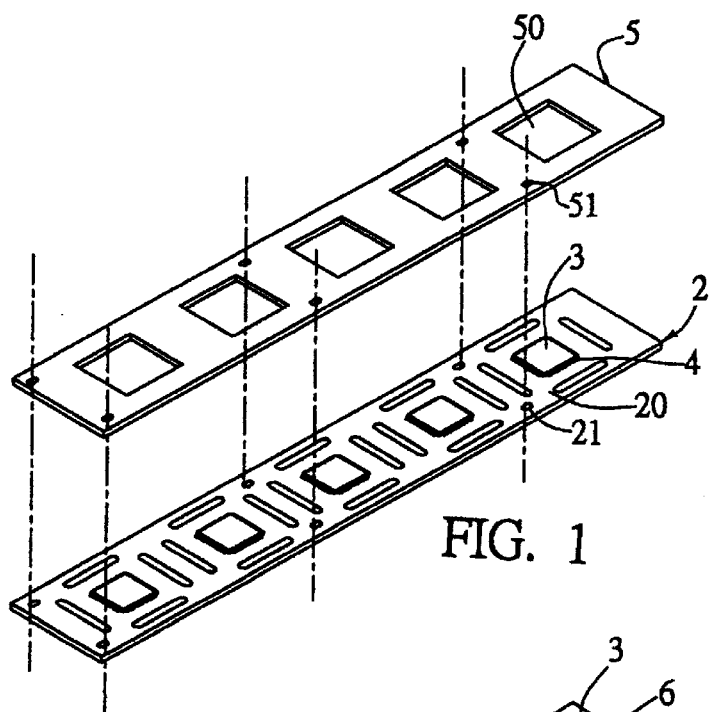
FIG. 1 is an exploded perspective view which illustrates the separator and the substrate to which the semiconductor chip is adhered in accordance with the first embodiment of the present invention.

In step 801, a single-arrayed substrate strip 2 consisting of five substrates 20 is prepared, as shown in FIG. 1. A plurality of electrically conductive traces are patterned on a top surface of each one of the substrates 20 and are electrically connected with a plurality of electrically conductive traces correspondingly formed on a bottom surface of each one of the substrates 20 via conductive through holes or vias (not shown) extending through the substrate 20. Conductive solder balls (not shown) arranged in an array form are adhered to the terminal ends of the electrically conductive traces on the bottom surface of the substrate 20. The electrically conductive traces, conductive vias, and conductive solder balls are conventional and have been explained in the background of the invention, so no detailed descriptions thereto are necessary herein. The substrate is made of a material, such as epoxy, polyimide, triazine, or phenolic resin. More specifically, a bismaleimidetraizine (BT) resin or FR4 resin is preferred. The substrate 20 has a die attach area in the center for a semiconductor chip 3 to be attached thereto through a die attach material, such as silver-filled epoxy. The die attach material needs to be cured at a high temperature for stabilization. After the semiconductor chip 3 has been mounted on each one of the substrate 20, the semiconductor chip 3 is electrically connected to the electrically conductor traces on the substrate 20 with bonding wires 4, such as gold wires with a diameter of about 18–50 $\mu$m, so that the semiconductor chip 3 can make electrical connection with external devices. Besides, there are a plurality of through holes 21 formed in a pair of corresponding sides of the substrates 20.

In step 802, the substrate body 2 with the semiconductor chips 3 are placed over a lower mold 6 of a two-piece mold by inserting a plurality of posts 61 protruded from the surface of the lower mold 6 into the corresponding through holes 21 of the substrates strip 2 to secure the substrate strip 2 to the lower mold 6.

Figure 2:
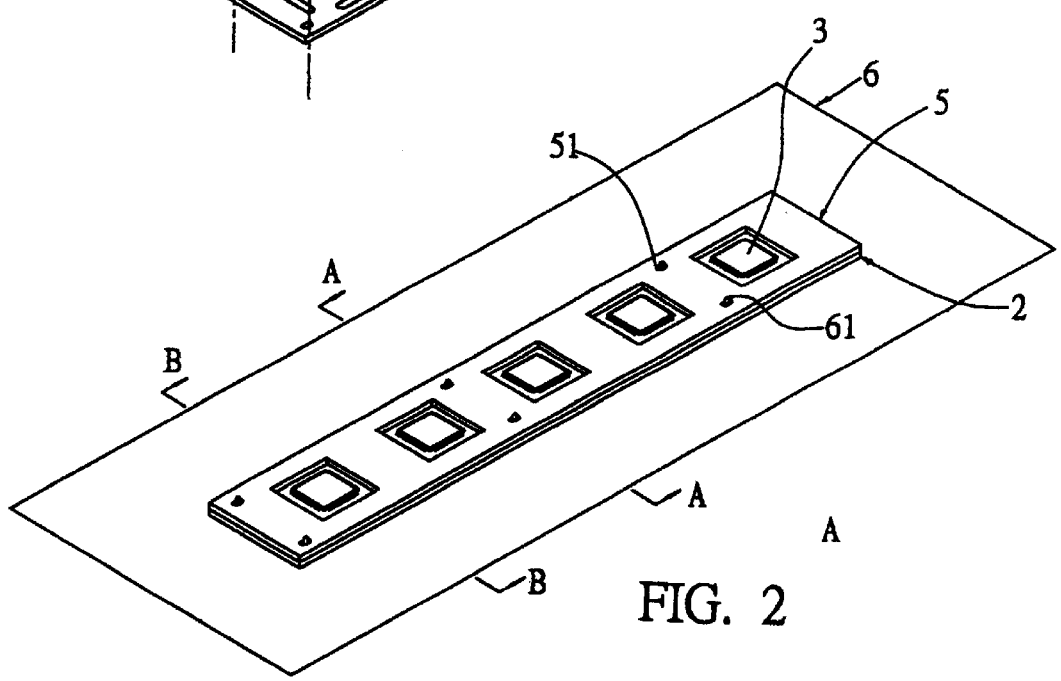
FIG. 2 is a perspective view which illustrates that after the separator is mounted on the substrate, the combined structure is placed on the lower mold of a two-piece mold in accordance with the first embodiment of the present invention.
Figure 3:
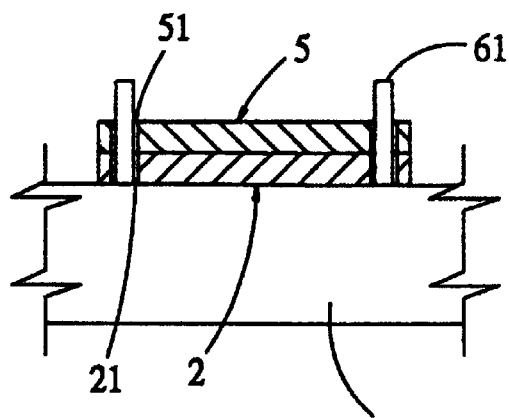
FIG. 3 is a cross-sectional view taken through the line A—A of FIG. 2.

In step 803, a separator 5 which is made of a metal, such as copper alloy or the like and has a size similar to that of the substrate strip 2, is mounted on the substrate strip 2. A plurality of openings 50 are formed in the separator 5 that each has an area greater than that of the semiconductor chip 3, so that after the separator 5 has been mounted on the substrate strip 2, the semiconductor chip 3 is received within the corresponding opening 50. There are also a plurality of insertion holes 51 separately formed along a pair of longitudinal sides of the separator 5 and corresponding to the through holes 21 of the substrate 20. Therefore, the posts 61 of the lower mold 6 are allowed to insert into the insertion holes 51 of the separator 5 through the through holes 21 of the substrate 20, subsequent to the mounting of the separator 5 on the substrate 20, as shown in FIG. 2 and 3. By inserting the posts 61 into the insertion holes 51 through the through holes 21, the separator 5 and the substrate strip 2 can be securely positioned over the lower mold half 6, so that the separator 5 would not slide over the top surface of the substrate strip 2 during transfer molding process.

However, the separator 5 can also be mounted on the substrate strip 2 prior to the placement of the substrate strip 2 on the lower mold 6. That is, the separator 5 can be mounted on the substrate 2 regardless whether the substrate strip 2 has been placed on the lower mold 6 or not.

Figure 4:
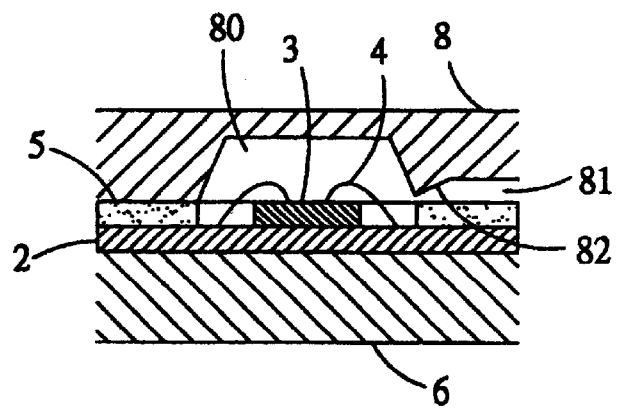
FIG. 4 is a cross-sectional view taken through the line B—B of FIG. 2, but with an upper mold covered over the lower mold.
Figure 5:
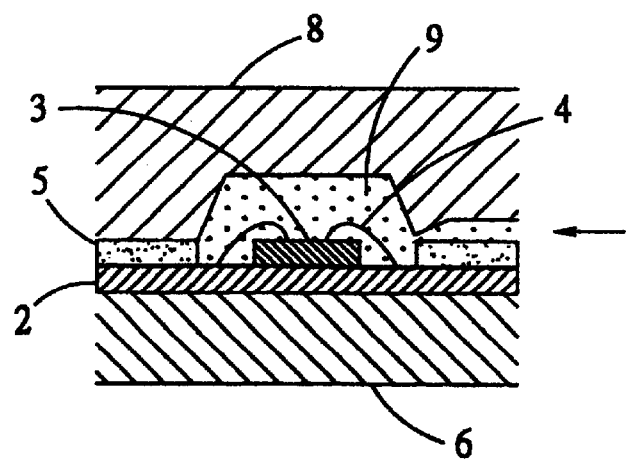
FIG. 5 is a cross-sectional view of FIG. 4 which illustrates the cavity of the upper mold is filled with molding compound.

In step 804, as shown in FIG. 4, an upper mold 8 is combined with the lower mold 6 in a manner that the stacked structure consisting of the separator 5 and the substrate strip 2 with semiconductor chips 3 attached thereto is received within a cavity 80 formed in the bottom of the upper mold 8. Molten molding compound 9 is then transferred from a molding compound tank (not shown) to the cavity 80 through a runner 81 and a gate 82 connected to the runner 81 and used for controlling the quantity and velocity of the molding compound flow to the cavity 80. A shown in FIG. 5, the molding compound 9 encloses the semiconductor chip 3 and a portion of the top surface of the substrate 20 and forms into an encapsulant after the cavity 80 has been filled with the molding compound 9. Meanwhile, excess molding compound 91 solidified in the runner 81 and gate 82 remains in and attaches to the surface of the separator 5.

Figure 6:
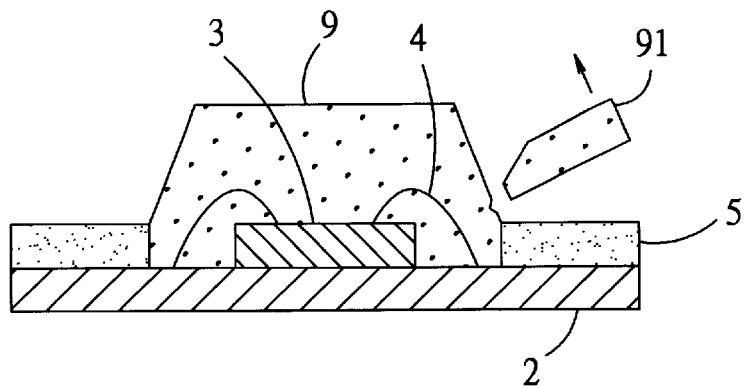
FIG. 6 is a cross-sectional view which illustrates that after the transfer molding is completed, the two-piece mold is removed and the excess molding compound solidified in the mold runner and gate is then peeled away from the separator, in accordance with the first embodiment of the present invention.
Figure 7:
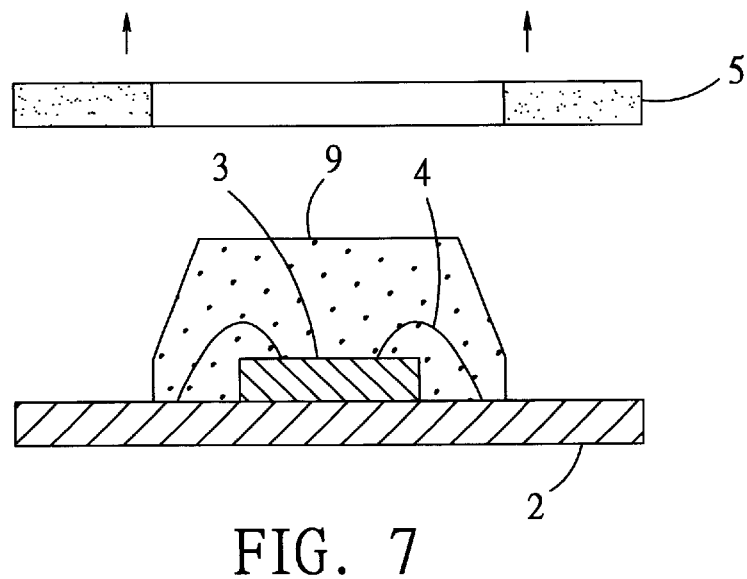
FIG. 7 is a cross-sectional view which illustrates that the separator is removed from the substrate, in accordance with the first embodiment of the present invention.

In step 805, after the molding compound 9 has been cured to harden the lower mold 6 and upper mold 8 are separated from the encapsulated body. The separator 5 is then removed from the top surface of the substrate strip 2, following the peeling away of the excess molding compound 91 from the separator 5, as shown in FIGS. 6 and 7. The separator 5 is made of metal so that the adhesion force between the excess molding compound 91 and the separator 5 is weaker than that between the excess molding compound 91 and the substrate 20, allowing the excess molding compound 91 to be easily peeled away from the separator 5 without damaging the substrate 20. The separator 5 can be ready for subsequent use right after its being removed from the substrate 20. In addition, the excess molding compound 91 is attached to the separator 5 rather than the substrate 20 thereby the substrate 20 is not contaminated by the excess molding compound 91 and does not require cleaning treatment thereto after the transfer molding process is completed.

Figure 10:
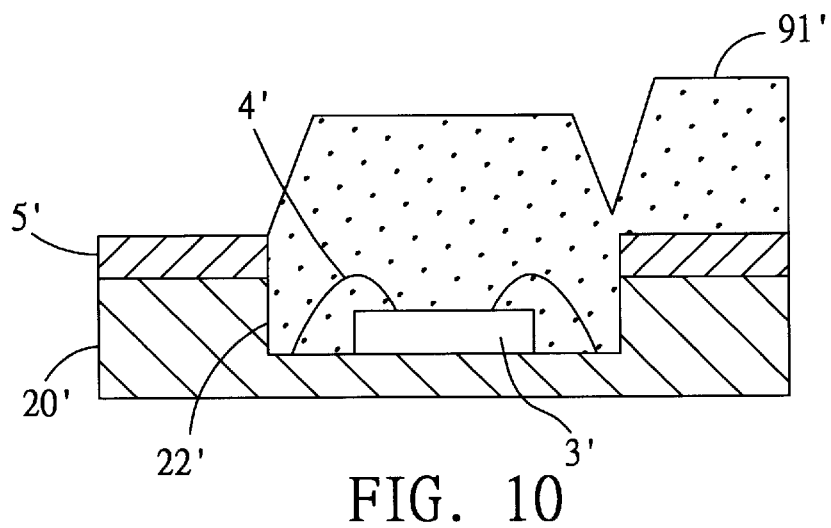
FIG. 10 is a cross-sectional view which illustrates a semiconductor package is formed after the transfer molding is completed in accordance with the second embodiment of the present invention.
Figure 9:
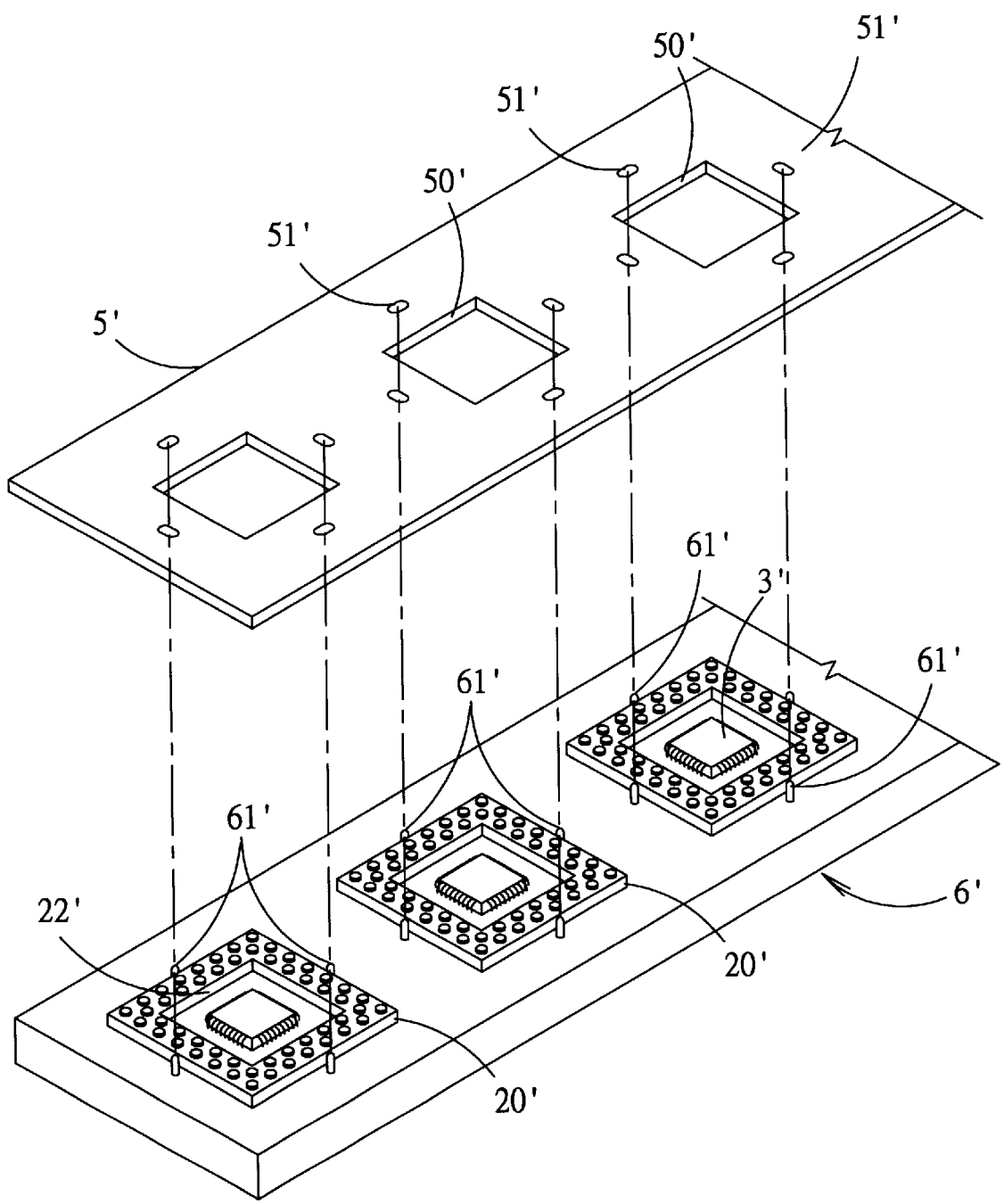
FIG. 9 is an exploded perspective view which illustrates the separator and the substrate with a semiconductor chip adhered thereto and placed on the lower mold of a two-piece mold in accordance with the second embodiment of the present invention.
Figure 11:
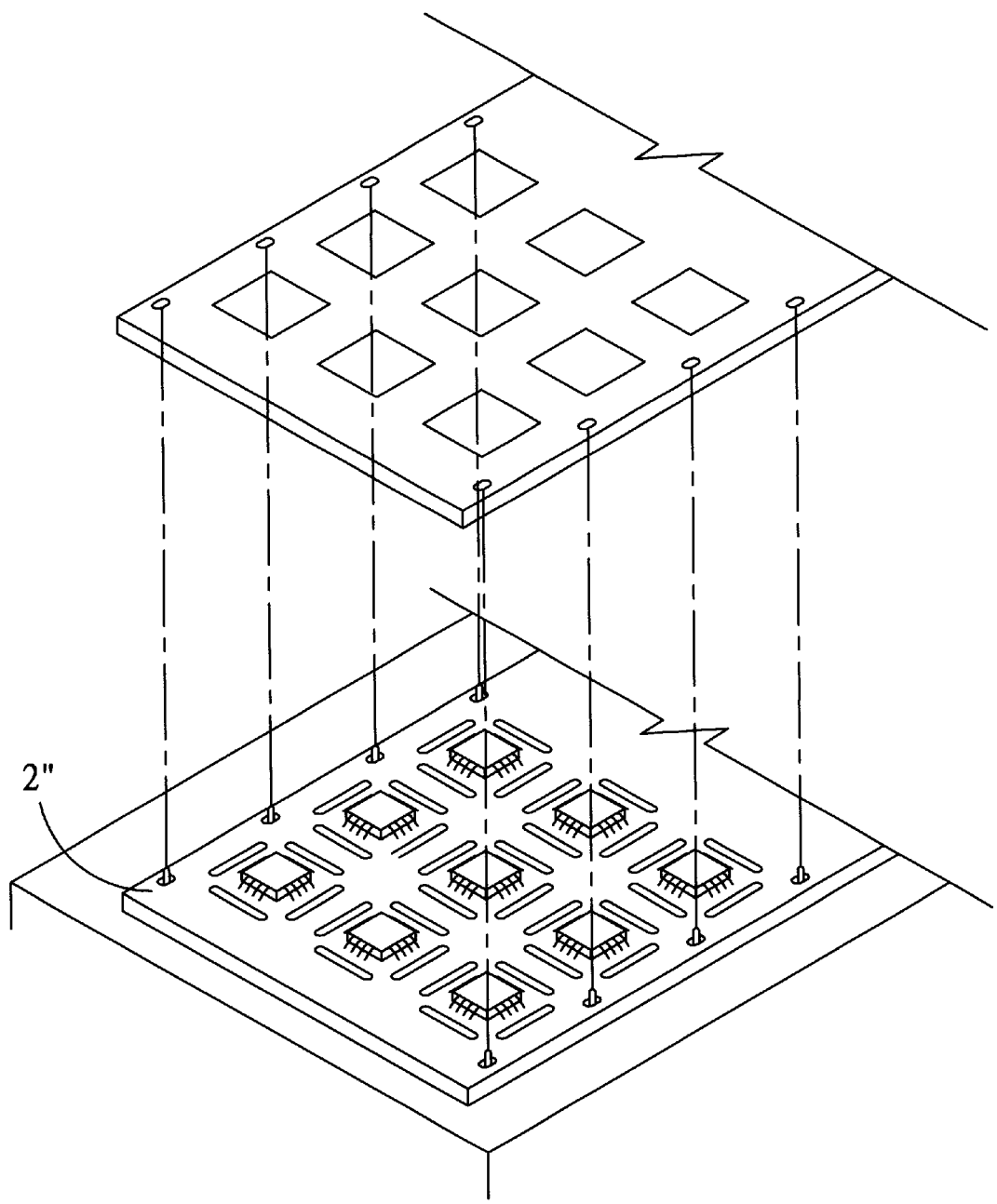
FIG. 11 is an exploded perspective view which illustrates the separator and the substrate with a semiconductor chip adhered thereto and placed on the lower mold of a two-piece mold in accordance with a third embodiment of the present invention.

FIG. 9 and 10 show a second embodiment of the present invention which is similar to the first embodiment. The difference between the first embodiment and the second embodiment is that the substrate 20' of the second embodiment is a singulated BGA substrate instead of a single-arrayed substrate strip 2'. In the second embodiment, the semiconductor chip 3' is adhered to a die attach region in the cavity 22' formed in a bottom surface of a singulated BGA substrate 20' and electrically connected to the singulated BGA substrate 20' by gold wires 4'. The singulated BGA substrate 20' with semiconductor chips 3 are then placed on a top surface of the lower mold 6' which has a plurality of posts 61' defining a receiving area for receiving the substrate 20' therein. By this arrangement, the singulated BGA substrate 20' is confined and positioned on the top surface of the lower mold 6'. Thereafter, a separator 5' with a plurality of through holes 51' corresponding to the plurality of posts 61' of the lower mold 6' is mounted on the singulated BGA substrate 20' by inserting the posts 61' into the corresponding through holes 51' respectively. After the transfer molding process is completed, the excess molding compound 91' solidified in the runner and gate (not shown) of an upper mold is attached to the separator 5'. The processes for removing the excess molding compound 91' from the separator 5' and the separator 5' from the substrate 20' are the same as described in the first embodiment.

Figure 12:
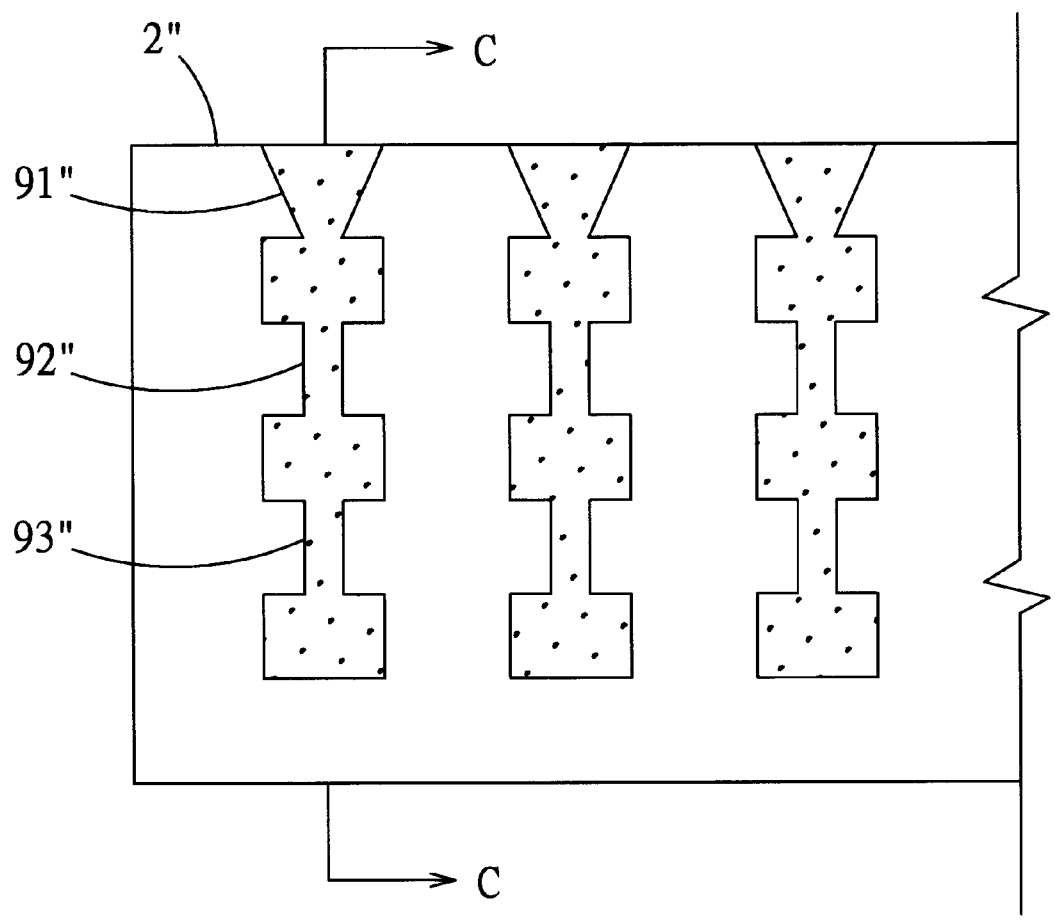
FIG. 12 is a top view which illustrates encapsulants are formed on the substrate after transfer molding is completed, in accordance with the third embodiment of the present invention.
Figure 15:
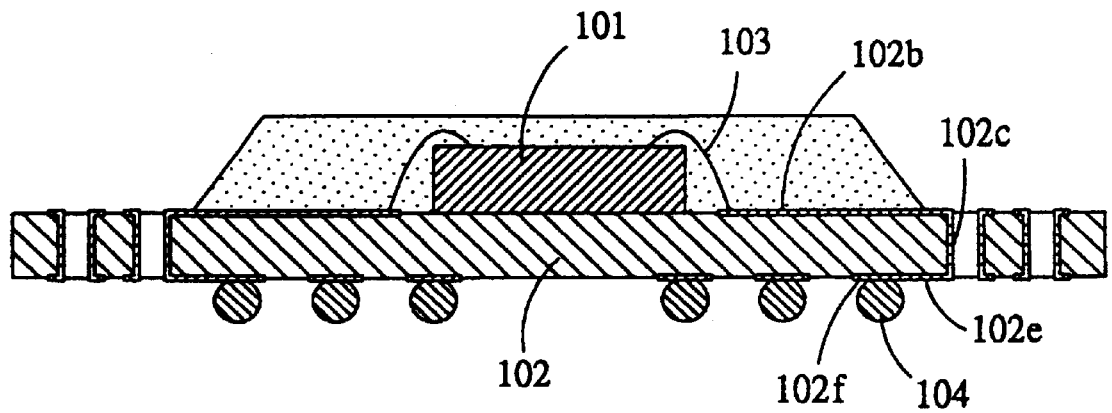
FIG. 15 is a cross-sectional view which illustrates a conventional BGA semiconductor package.
Figure 16:
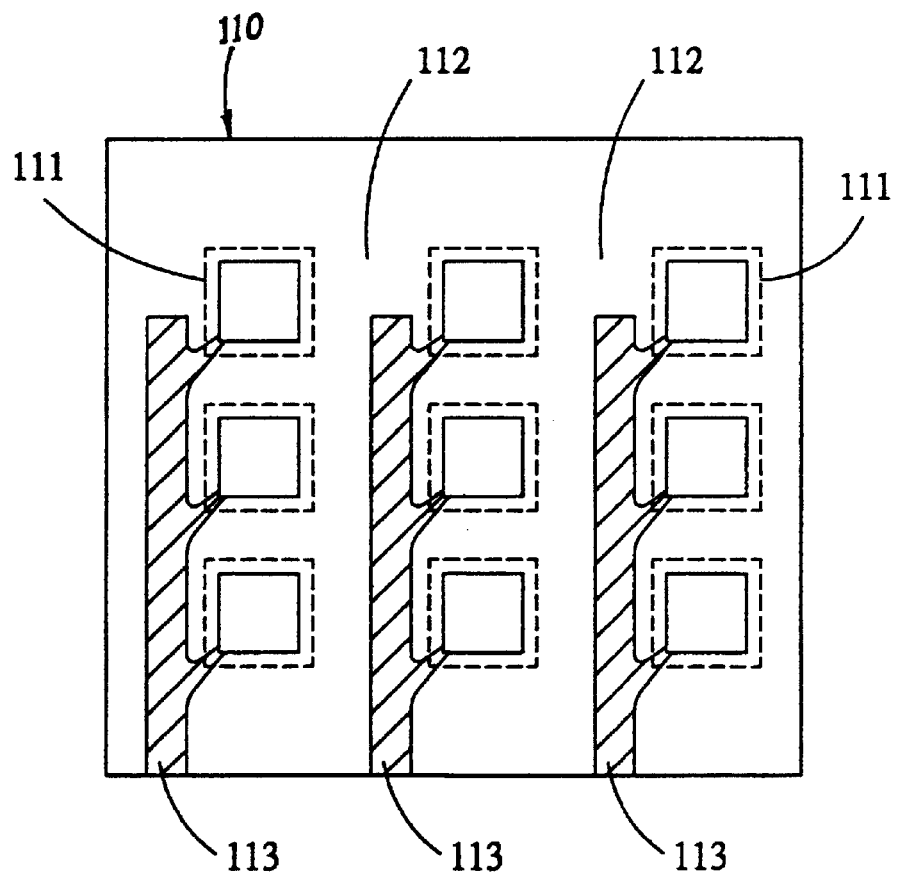
FIG. 16 is a top view which illustrates a multiplicity of substrates formed in a strip after formation of a gold coating according to U.S. Pat. No. 5,635,671.
Figure 17:
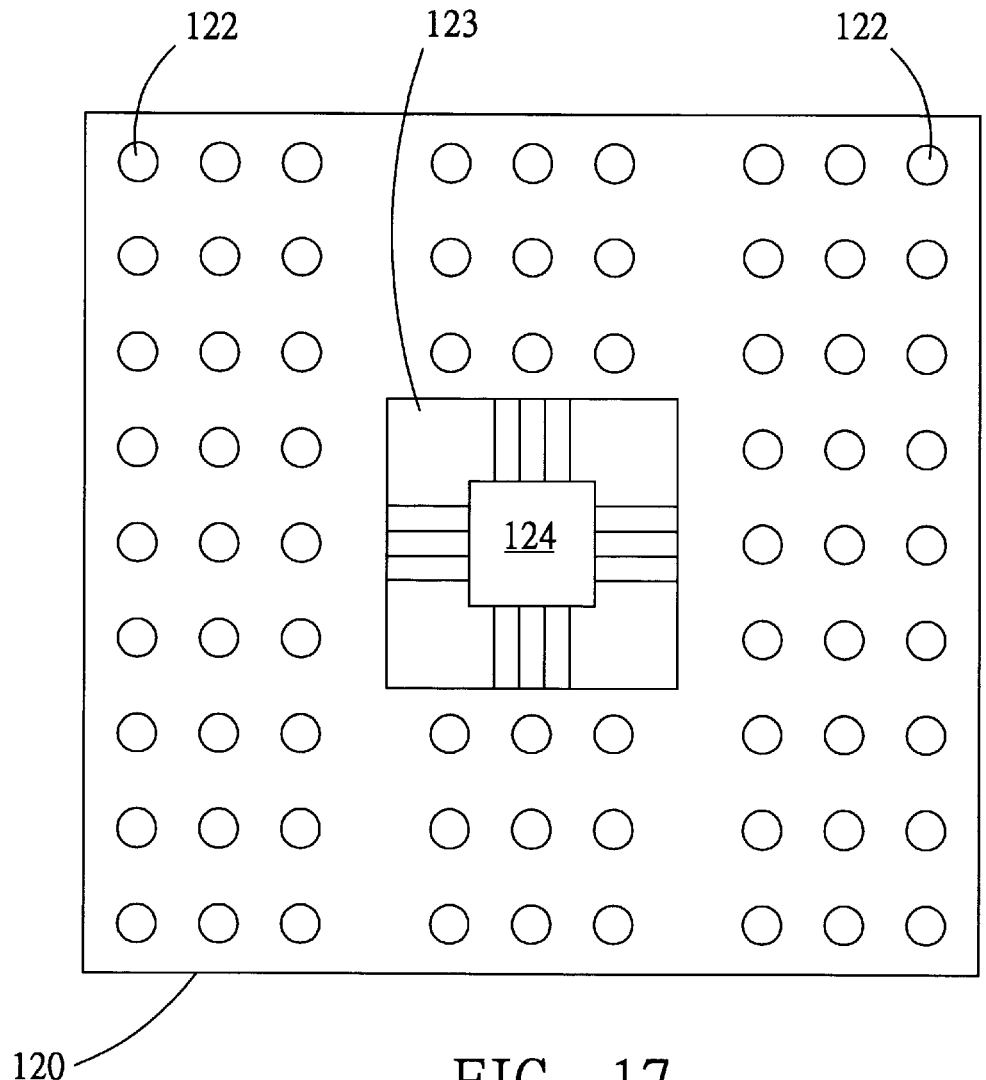
FIG. 17 is a bottom view which illustrates a conventional BGA substrate with a cavity formed in the bottom surface for receiving a semiconductor chip therein.
Figure 18:
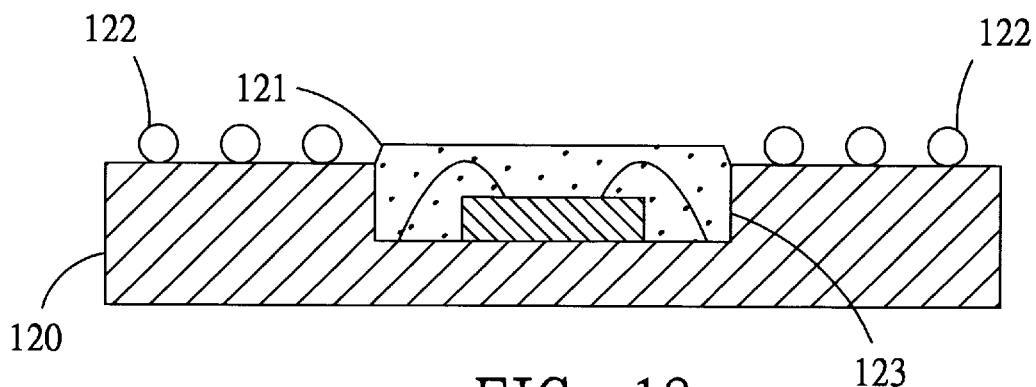
FIG. 18 is a cross-sectional view which illustrates a conventional cavity-down (singulated) BGA semiconductor package.

FIG. 11 to 14 show a third embodiment of the present invention which is similar to the aforesaid first embodiment. However, the substrate board 2" of the third embodiment is formed into a matrix form. Meanwhile, there are also a plurality of openings 50" arranged in a matrix form formed in the separator 5" for receiving the semiconductor chips 3 adhered to the substrate board 2". After the transfer molding process is completed, as shown in FIG. 12, the excess molding compound solidified in the runners and gates of the mold (not shown) also attaches to the separator 5" to sequentially form the first excess encapsulant 91", the second excess encapsulant 92", and the third excess encapsulant 93", and then, after sequentially removing the first excess encapsulant 91", and disconnecting the second excess encapsulant 92" and the third excess encapsulant 93" from the separator 5", the separator 5" is removed from the substrate board 2".

What is claimed as:

1. A method for making a semiconductor package, comprising the following steps of:

attaching a semiconductor chip to a substrate, and then making electrical connection between the semiconductor chip and electrically conductive traces formed on the substrate;

placing the substrate with the semiconductor chip on a lower mold of a two piece mold;

mounting on the substrate a separator having at least one opening for receiving to the semiconductor chip attached to the substrate, wherein the opening is greater in area than the semiconductor chip so that the semiconductor chip is peripherally surrounded by the boundary of the opening, and wherein the separator is smaller in thickness than the semiconductor chip so that the semiconductor chip is protruded from the opening of the separator subsequent to the mounting of the separator on the substrate;

covering an upper mold of the two-piece mold over the lower mold for transferring molding compound through a mold runner and a mold gate connected to a mold cavity formed on the upper mold which interconnects the opening of the separator to allow the semiconductor chip to be received in the mold cavity via the opening of the substrate, into the mold cavity to form an encapsulant enclosing the semiconductor and at least a portion of the surface of the substrate to which the semiconductor chip is attached; and removing away from the separator excess molding compound solidified in the mold runner and mold gate of the mold, followed by separating the separator from the substrate.

2. The method as claimed in claim 1, wherein the separator is made of a metal.

3. The method as claimed in claim 2, wherein the separator is made of copper alloy.

4. The method as claimed in claim 1, wherein the separator is substantially the same in size as the substrate.

5. The method as claimed in claim 1, wherein a plurality of insertion holes are formed through the separator and a plurality of through holes are formed through the substrate, thereby allowing a plurality of posts protruded from a top surface of the lower mold to insert into the corresponding insertion holes of the separator and through holes of the substrate.

6. The method as claimed in claim 1, wherein the electrical connection between the semiconductor chip and the substrate is made by wire bonding.

7. The method as claimed in claim 1, wherein the electrical connection between the semiconductor chip and the substrate is made by flip chip bumping.

8. A method for making a semiconductor package, comprising the following steps of:

attaching a semiconductor chip to a substrate, and then making electrical connection between the semiconductor chip and electrically conductive traces formed on the substrate;

mounting on the substrate a separator having at least one opening for receiving to the semiconductor chip attached to the substrate, wherein the opening is greater in area than the semiconductor chip so that the semiconductor chip is peripherally surrounded by the boundary of the opening, and wherein the separator is smaller in thickness than the semiconductor chip so that the semiconductor chip is protruded from the opening of the separator subsequent to the mounting of the separator on the substrate;

placing the substrate with the semiconductor chip on a lower mold of a two piece mold;

covering an upper mold of the two-piece mold over the lower mold for transferring molding compound through a mold runner and a mold gate connected to a mold cavity formed on the upper mold which interconnects the opening of the separator to allow the semiconductor chip to be received in the mold cavity via the opening of the substrate, into the mold cavity to form an encapsulant enclosing the semiconductor and at least a portion of the surface of the substrate to which the semiconductor chip is attached; and removing away from the separator excess molding compound solidified in the mold runner and mold gate of the mold, followed by separating the separator from the substrate.

9. The method as claimed in claim 8, wherein the separator is made of a metal.

10. The method as claimed in claim 9, wherein the separator is made of copper alloy.

11. The method as claimed in claim 8, wherein the separator is substantially the same in size as the substrate.

12. The method as claimed in claim 8, wherein a plurality of insertion holes are formed through the separator, and a plurality of through holes are formed through the substrate, thereby allowing a plurality of posts protruded from a top surface of the lower mold to insert into the corresponding insertion holes of the separator and through holes of the substrate.

13. The method as claimed in claim 8, wherein the electrical connection between the semiconductor chip and the substrate is made by wire bonding.

14. The method as claimed in claim 8, wherein the electrical connection between the semiconductor chip and the substrate is made by flip chip bumping.

15. The method as claimed in claim 8, wherein the substrate is the singulated BGA substrate, single-arrayed BGA substrate, dual-arrayed BGA substrate, or a matrix BGA substrate.

* * * * *